United States Patent
Yamaguchi

(10) Patent No.: US 10,187,981 B2
(45) Date of Patent: Jan. 22, 2019

(54) MULTI-WIRE WIRING BOARD

(71) Applicant: HITACHI CHEMICAL COMPANY, LTD., Tokyo (JP)

(72) Inventor: Hiroyuki Yamaguchi, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 15/122,079

(22) PCT Filed: Feb. 25, 2015

(86) PCT No.: PCT/JP2015/055404
§ 371 (c)(1),
(2) Date: Feb. 3, 2017

(87) PCT Pub. No.: WO2015/129752
PCT Pub. Date: Sep. 3, 2015

(65) Prior Publication Data
US 2017/0171967 A1    Jun. 15, 2017

(30) Foreign Application Priority Data

Feb. 27, 2014    (JP) .................. 2014-036667

(51) Int. Cl.
*H05K 1/02*    (2006.01)
*H05K 3/10*    (2006.01)
(Continued)

(52) U.S. Cl.
CPC ........... *H05K 1/0298* (2013.01); *H01B 3/305* (2013.01); *H01B 3/306* (2013.01); *H01B 3/445* (2013.01);
(Continued)

(58) Field of Classification Search
CPC ...... H05K 3/103; H05K 1/0298; H01B 3/305; H01B 3/306; H01B 3/445
(Continued)

(56) References Cited

U.S. PATENT DOCUMENTS 4,560,829 A * 12/1985 Reed .................. C08J 9/146
    174/102 R
4,602,318 A * 7/1986 Lassen .................. H01L 21/486
    174/261

(Continued)

FOREIGN PATENT DOCUMENTS

JP    S45-21434 B    7/1970
JP    H5-13923 A    1/1993
(Continued)

OTHER PUBLICATIONS

English Translation of Hitachi Chemical Co. (JP 2006-294683).*
(Continued)

*Primary Examiner* — Steven T Sawyer
(74) *Attorney, Agent, or Firm* — Fitch, Even, Tabin & Flannery, LLP

(57) ABSTRACT

A multi-wire wiring board including insulation-coated wires each including a wire and a wire coating layer, and a wire-laying adhesive sheet on which the insulation-coated wires are wire-laid, in which the multi-wire wiring board includes a wire-laying adhesive sheet on which a high-frequency-compatible wire is disposed, the high-frequency-compatible wire including the wire coating layer being a low-dielectric resin having a relative permittivity less than 3.6 at 10 GHz, and a wire-laying adhesive sheet on which a general wire is disposed, the general wire including the wire coating layer being a general resin having a relative permittivity of 3.6 or more at 10 GHz.

20 Claims, 3 Drawing Sheets

(51) Int. Cl.
*H05K 3/46* (2006.01)
*H01B 3/30* (2006.01)
*H01B 3/44* (2006.01)
*H01P 3/08* (2006.01)

(52) U.S. Cl.
CPC .............. *H01P 3/082* (2013.01); *H01P 3/088* (2013.01); *H05K 1/024* (2013.01); *H05K 1/0237* (2013.01); *H05K 3/103* (2013.01); *H05K 3/4685* (2013.01); *H05K 3/4688* (2013.01); *H05K 2201/10356* (2013.01)

(58) Field of Classification Search
USPC ........................................................ 174/251
See application file for complete search history.

(56) References Cited

U.S. PATENT DOCUMENTS

| | | | | | |
|---|---|---|---|---|---|
| 4,646,436 | A | * | 3/1987 | Crowell | H01P 11/003 174/251 |
| 4,908,939 | A | * | 3/1990 | Shieber | H05K 1/0219 174/257 |
| 4,972,050 | A | * | 11/1990 | Hammond | H05K 1/113 174/251 |
| 5,233,133 | A | * | 8/1993 | Iwasaki | H05K 1/0219 174/250 |
| 5,378,857 | A | * | 1/1995 | Swailes | H05K 1/111 174/251 |
| 5,928,757 | A | * | 7/1999 | Shinada | H05K 3/429 428/137 |
| 2010/0319961 | A1 | * | 12/2010 | Honda | H01B 3/305 174/120 SR |

FOREIGN PATENT DOCUMENTS

| | | |
|---|---|---|
| JP | H6-309936 A | 11/1994 |
| JP | H11-260152 A | 9/1999 |
| JP | 2002-050850 A | 2/2002 |
| JP | 2002-157919 A | 5/2002 |
| JP | 2005-277022 A | 10/2005 |
| JP | 2006-294683 A | 10/2006 |
| JP | 2011-154819 A | 8/2011 |

OTHER PUBLICATIONS

International Search Report of WO Appln. No. PCT/JP2015/055404 dated Jun. 2, 2015 in English.
International Preliminary Report on Patentability of WO Patent Application No. PCT/JP2015/055404 dated Aug. 30, 2016 in English.

* cited by examiner

MULTI-WIRE WIRING BOARD

TECHNICAL FIELD

The present invention relates to a multi-wire wiring board using insulation-coated wires as wires, in particular, a multi-wire wiring board in which a high-frequency-compatible wire and a general wire are used in combination.

BACKGROUND ART

In recent years, enhancement in functionality of electronic apparatuses requires an extremely high wiring density. Wiring boards with high wiring density as described above include a wiring board (hereinafter referred to as multi-wire wiring board) using insulation-coated wires as necessary wires.

As disclosed in Patent Literature 1, a multi-wire wiring board is manufactured by forming an adhesive sheet (hereinafter also referred to as "wire-laying adhesive sheet") having adhesiveness to insulation-coated wires on an internal layer substrate on which circuits such as a power source layer and a ground layer are formed, thereafter laying wires insulation-coated with polyimide resin or the like by a numerically controlled wire-laying apparatus, fixing the wires by layering or the like, providing through holes running across the wires, and subjecting inside of each of the through holes to electroless metal plating. The term "wire-laying" means laying an insulation-coated wire on an adhesive layer, and simultaneously bonding the wire with ultrasonic waves. The insulation-coated wire used for the multi-wire wiring board includes a wire (hereinafter also referred to as "core wire"), a wire coating layer disposed around the wire, and a wire adhesive layer disposed around the wire coating layer (Patent Literatures 1 to 4).

CITATION LIST

Patent Literature

Patent Literature 1: Japanese Examined Patent Publication No. S45-21434
Patent Literature 2: Japanese Unexamined Patent Publication No. H6-309936
Patent Literature 3: Japanese Unexamined Patent Publication No. H11-260152
Patent Literature 4: Japanese Unexamined Patent Publication No. 2002-050850

SUMMARY OF INVENTION

Technical Problem

With recent increase in an operating speed of electronic apparatuses, electronic signals flowing through a wiring board transmit more information for a short time, and have increasingly high frequencies. In design of boards compatible with high frequency, it is required to consider conductor loss and dielectric loss. Increasing thickness of the conductor of the signal line is effective for the conductor loss, and decreasing the relative permittivity and dielectric loss tangent of the base material to be used and the material disposed around the signal line, such as prepreg, is effective for the dielectric loss. Because the conductor width of the compatible signal line is limited in a wiring board with increased density, improvement in dielectric loss becomes important.

In a multi-wire wiring board, a possible structure is a structure using a high-frequency wire including a fluorine-resin-based insulation coating around the wire to be compatible with high frequency. Generally, because insulation-coated wires of a single type are used, high-frequency wires are used for wires that do not require compatibility with high frequency, and such a structure causes increase in cost. In addition, because high-frequency wires have lower strength of the wire coating layer than that of general wires, when high-frequency wires are bent to cross each other, the wire coating layers in the bent portions may be peeled off, and the core wires may contact each other. In view of such a fear, a design is required to avoid wiring of crossing high-frequency wires, and consequently the number of wiring layers may increase.

The present invention has been made in consideration of the above circumstances, and an object of the present invention is to provide a multi-wire wiring board preventing increase in cost, and enabling compatibility with high frequency and reduction in the number of wiring layers.

Solution to Problem

The present invention relates to the following.

1. A multi-wire wiring board including insulation-coated wires each including a wire and a wire coating layer, and a wire-laying adhesive sheet on which the insulation-coated wires are wire-laid, in which the multi-wire wiring board includes a wire-laying adhesive sheet on which a high-frequency-compatible wire is disposed, the high-frequency-compatible wire including the wire coating layer being a low-dielectric resin having a relative permittivity less than 3.6 at 10 GHz, and a wire-laying adhesive sheet on which a general wire is disposed, the general wire including the wire coating layer being a general resin having a relative permittivity of 3.6 or more at 10 GHz.

2. The multi-wire wiring board of item 1, in which the high-frequency-compatible wire including the wire coating layer being a low-dielectric resin having a relative permittivity less than 3.6 at 10 GHz and the general wire including the wire coating layer being a general resin having a relative permittivity of 3.6 or more at 10 GHz are arranged to cross each other on the wire-laying adhesive sheet.

3. The multi-layer wiring board of item 1 or 2, in which the high-frequency-compatible wire including the wire coating layer being a low-dielectric resin having a relative permittivity less than 3.6 at 10 GHz and the general wire including the wire coating layer being a general resin having a relative permittivity of 3.6 or more at 10 GHz are arranged on the wire-laying adhesive sheet such that the high-frequency wire is disposed under the general wire to cross each other.

4. The multi-layer wiring board of any one of items 1 to 3, in which the same wire-laying adhesive sheet has two or more types of characteristic impedances.

5. The multi-layer wiring board of any one of items 1 to 4, in which the wire coating layer of the high-frequency-compatible wire is one or a combination of two or more of a fluorine resin, a polyamide imide resin, and a low-dielectric polyimide resin with a relative permittivity less than 3.6 at 10 GHz.

Advantageous Effects of Invention

The present invention provides a multi-wire multi-layer wiring board preventing increase in cost, and enabling compatibility with high frequency and reduction in the number of wiring layers.

DESCRIPTION OF EMBODIMENTS

Figure 1:
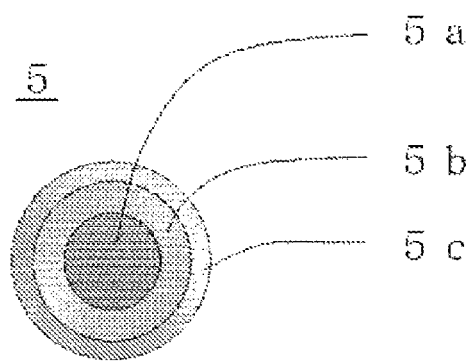
FIG. 1 is a schematic cross-sectional view of a high-frequency wire used for a multi-wire multi-layer wiring board according to an embodiment of the present invention.
Figure 2:
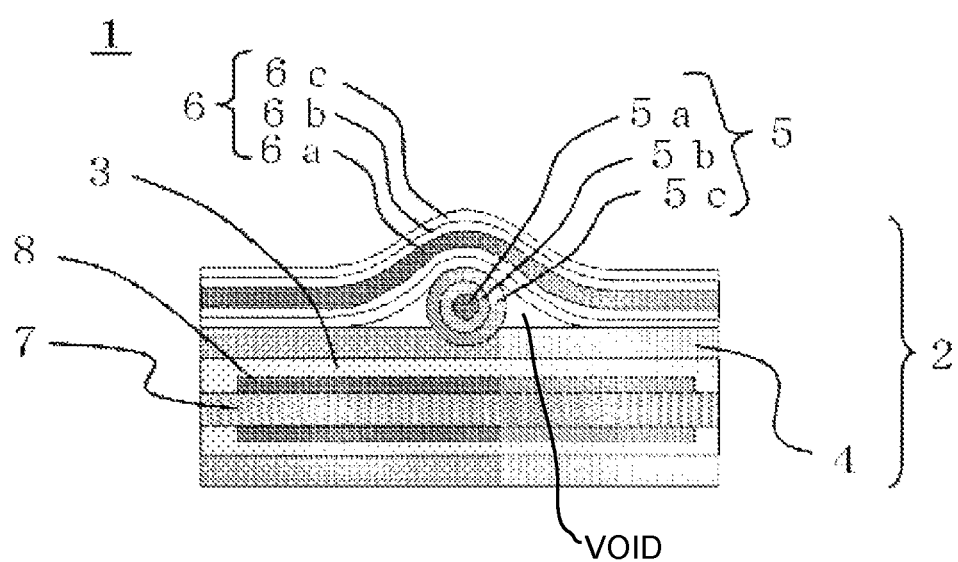
FIG. 2 is a schematic cross-sectional view of the multi-wire multi-layer wiring board according to an embodiment of the present invention.

An embodiment of a multi-wire wiring board according to the present invention will be explained hereinafter with reference to FIG. 1 to FIG. 3. As illustrated in FIG. 1 and FIG. 2, a multi-wire wiring board according to the present embodiment includes insulation-coated wires 5 and 6 including wires 5a and 6a and wire coating layers 5b and 6b, respectively, and a wire-laying adhesive sheet 4 on which the insulation-coated wires 5 and 6 are wire-laid. In addition, the multi-wire wiring board includes a wire-laying adhesive sheet 4 on which the high-frequency-compatible wire 5 is disposed, and a wire-laying adhesive sheet 4 on which the general wire 6 is disposed. The high-frequency-compatible wire 5 includes the wire coating layer 5b being a low-dielectric resin having a relative permittivity less than 3.6 at 10 GHz, and the general wire 6 includes the wire-coating layer 6b being a general resin having a relative permittivity of 3.6 or more at 10 GHz.

The multi-wire wiring board according to the present embodiment enables acquisition of wires with small signal transmission loss and excellent signal transmission property, because the multi-wire wiring board includes a high-frequency-compatible wire. In addition, because the multi-wire wiring board according to the present embodiment includes a general wire, the multi-wire wiring board increases the capacity for wires, and enables increase in density of wires. This structure provides a multi-wire wiring board with excellent signal transmission property and high wire density. In addition, because general wires are used for wires that do not require high-frequency compatibility, this structure prevents increase in cost.

In the structure, the high-frequency-compatible wire including the wire coating layer being a low-dielectric resin with a relative permittivity less than 3.6 at 10 GHz and the general wire including the wire coating layer being a general resin with a relative permittivity of 3.6 or more at 10 GHz are preferably arranged to cross each other on the wire-laying adhesive sheet.

Because the high-frequency-compatible wire and the general wire are arranged to cross each other on the wire-laying adhesive sheet of one layer, this structure removes the necessity for separately preparing a wire-laying adhesive sheet on which the high-frequency wire is disposed, and a wire-laying adhesive sheet on which the general wire is disposed, and reduces the number of wiring layers.

In the structure, the high-frequency-compatible wire including the wire coating layer being a low-dielectric resin with a relative permittivity less than 3.6 at 10 GHz and the general wire including the wire coating layer being a general resin with a relative permittivity of 3.6 or more at 10 GHz are preferably arranged on the wire-laying adhesive sheet such that the high-frequency wire is disposed under the general wire to cross each other.

Because a high-frequency wire has lower strength of the wire coating layer than that of a general wire, when high-frequency wires are bent to cross each other, the wire coating layers in the bent portions may be thinned, and there is the fear that insulation property between the core wires is not secured. With the structure in which the high-frequency wire is disposed under the general wire to cross each other as described above, the high-frequency wire disposed under the general wire is enabled to cross the general wire in a state in which the high-frequency wire is hardly bent, and the core wires are prevented from contacting each other. In addition, because this structure enables easy arrangement of the high-frequency wire and the general wire to cross each other, this structure removes the necessity for increasing the wire-laying adhesive layer, and reduces the number of wiring layers, even when different wires are used such that a high-frequency wire is used for a wire requiring high-frequency compatibility and a general wire is used for a wire that does not require high-frequency compatibility.

The same wire-laying adhesive sheet preferably has two or more types of characteristic impedances. This structure is achieved by arranging a high-frequency wire and a general wire having different relative permittivities of the wire coating layers together on a wire-laying adhesive sheet of one layer, as described above. This structure enables reduction in the number of wiring layers.

The wire coating layer of the high-frequency-compatible wire is preferably one or a combination of at least two of a fluorine resin, a polyamide imide resin, and a low-dielectric polyimide resin having a relative permittivity less than 3.6 at 10 GHz. With the insulation-coated wire according to the present embodiment with the structure, the relative permittivity of the wire coating layer and the relative permittivity of the wire adhesive layer are smaller than those of an ordinary FR-4 material (Flame Retardant Type 4, with a relative permittivity of approximately 3.9 at 10 GHz). This structure achieves small dielectric loss of a high-frequency signal, and improves the transmission property. In addition, these materials with small relative permittivity used for the wire coating layer or the wire adhesive layer generally incur high cost, but it suffices that these materials are used for only the circumference of the wire or the wire coating layer. This structure saves the use amount of the materials with small relative permittivity, and prevents increase in cost for the whole wiring board.

EXAMPLE

The present invention will be specifically explained hereinafter with an example, but the present invention is not limited to the following example.

Figure 3:
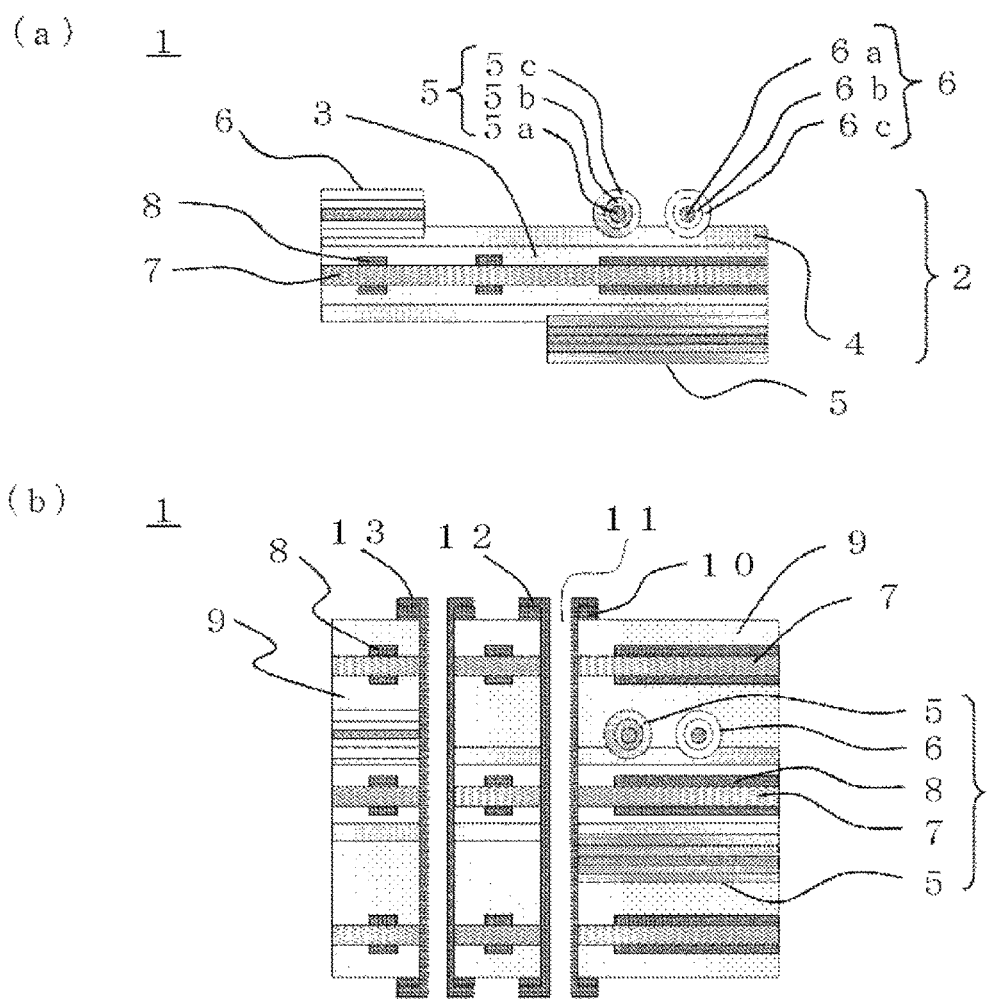
FIG. 3 is a schematic cross-sectional view illustrating a manufacturing process of the multi-wire multi-layer wiring board according to the embodiment of the present invention.

FIG. 3 schematically illustrates an example of a manufacturing process of a multi-wire wiring board according to the present invention. Step (a) is a step of forming circuits on a copper-clad laminate (manufactured by Hitachi Chemical Co., Ltd., product name: MCL-I-671, "MCL" is a registered trademark), forming an underlay layer 3 with an insulating prepreg by lamination, laminating a wire-laying adhesive sheet 4 (manufactured by Hitachi Chemical Co., Ltd., product name: HPAI), and wire-laying and fixing a high-frequency-compatible wire 5 and a general wire 6. The wire-laying adhesive sheet 4 is of a thermosetting type. The wires 5 and 6 were wire-laid by a numerically controlling device with an ultrasonic output of 25 KHz and at a wire-laying speed of 25 mm/sec, thereafter the wires 5 and 6 and the wire-laying adhesive sheet 4 were cured and fixed by heat treatment at 200° C. for 90 minutes.

Step (b) of FIG. 3 is a step in which a copper foil 10 (manufactured by Nippon Denkai Ltd., product name: NDGR), an internal layer substrate 7 in which circuits are formed on a copper-clad laminate (manufactured by Hitachi Chemical Co., Ltd., product name: MCL-I-671), and an insulating material prepreg 9 (manufactured by Hitachi Chemical Co., Ltd., product name: GFA-2) were laminated into a multi-layered structure and united, thereafter through holes were formed by a drill in a position to connect the wires 5 and 6 with the surface layer and in a position to connect the ground layer of the internal layer circuit 8 with the surface layer (external layer circuit 13), hole cleaning was performed by treatment with permanganate, the through holes were subjected to plating 12 by electroless copper plating (electroless copper plating of a reduction type), and thereafter a necessary external layer circuit 13 was formed by etching.

As described above, a multi-wire wiring board preventing increase in cost and enabling high-frequency compatibility and reduction in thickness was obtained.

INDUSTRIAL APPLICABILITY

The multi-wire wiring board according to the present invention is industrially effective, because it prevents increase in cost and enables high-frequency compatibility and reduction in thickness.

REFERENCE SIGNS LIST

1 MULTI-WIRE WIRING BOARD
2 WIRE-LAYING SUBSTRATE
3 UNDERLAY LAYER (PREPREG)
4 WIRE-LAYING ADHESIVE SHEET
5 HIGH-FREQUENCY-COMPATIBLE WIRE
  5a WIRE
  5b WIRE COATING LAYER
  5c WIRE ADHESIVE LAYER
6 GENERAL WIRE
  6a WIRE
  6b WIRE COATING LAYER
  6c WIRE ADHESIVE LAYER
7 INTERNAL LAYER SUBSTRATE
8 INTERNAL LAYER CIRCUIT OR INTERNAL LAYER COPPER FOIL
9 PREPREG
10 EXTERNAL LAYER COPPER FOIL
11 THROUGH HOLE
12 PLATING
13 EXTERNAL LAYER CIRCUIT

The invention claimed is:

1. A multi-wire wiring board comprising:
a wiring adhesive sheet;
a first insulated wire provided on the wiring adhesive sheet, the first insulated wire comprising a first wire, a first coating layer surrounding the first wire, the first coating layer comprising a low-dielectric resin having a relative permittivity less than 3.6 at 10 GHz, and a first adhesive layer surrounding the first coating layer;
a second insulated wire provided on the wiring adhesive sheet, the second insulated wire comprising a second wire, a second coating layer surrounding the second wire, the second coating layer comprising a general resin having a relative permittivity of 3.6 or more at 10 GHz, and a second adhesive layer surrounding the second coating layer; and
a prepreg that covers the first and second insulated wires, wherein the first insulated wire and the second insulated wire are arranged on the wiring adhesive sheet to cross each other at a crossing point so as to define a void between the first insulated wire and the second insulated wire adjacent the crossing point.

2. The multi-layer wiring board of claim 1, wherein the first insulated wire is disposed under the second insulated wire in a region in which the first and second insulated wires cross each other such that the second insulated wire is bent more than the first insulated wire in region in which the second insulated wire crosses over the first insulated wire.

3. The multi-layer wiring board of claim 1, wherein the wiring adhesive sheet has two or more types of characteristic impedances.

4. The multi-layer wiring board of claim 1, wherein the first coating layer comprises one or a combination of two or more of a fluorine resin, a polyamide imide resin, and a low-dielectric polyimide resin with a relative permittivity less than 3.6 at 10 GHz.

5. The multi-wire wiring board according to claim 1, wherein a strength of the first coating layer is lower than a strength of the second coating layer.

6. The multi-wire wiring board according to claim 1, wherein the first and second insulated wires are arranged on the wiring adhesive sheet so as to have portions parallel each other.

7. The multi-wire wiring board according to claim 1, wherein the first insulated wire is disposed on the wiring adhesive sheet in a state in which the first insulated wire is hardly bent.

8. The multi-wire wiring board according to claim 1, wherein the first adhesive layer comprises one or a combination of two or more of a fluorine resin, a polyamide imide resin, and a low-dielectric polyimide resin with a relative permittivity less than 3.6 at 10 GHz.

9. The multi-wire wiring board according to claim 1, Wherein the wire adhesive sheet is arranged on an internal layer substrate through an underlay layer.

10. The multi-wire wiring board according to claim 1, further comprising a through-hole that penetrates the multi-wire wiring board.

11. The multi-wire wiring board according to claim 10, wherein the first insulated wire does not connect the through-hole.

12. The multi-wire wiring board according to claim 10, wherein the first insulated wire connects the through-hole.

13. A multi-wire wiring board comprising:
a wiring adhesive sheet;
a first insulated wire provided on the wiring adhesive sheet, the first insulated wire comprising a first wire, a first coating layer surrounding the first wire, the first coating layer comprising a low-dielectric resin having a relative permittivity less than 3.6 at 10 GHz, and a first adhesive layer surrounding the first coating layer; and
a second insulated wire provided on the wiring adhesive sheet, the second insulated wire comprising a second wire, a second coating layer surrounding the second wire, the second coating layer comprising a general resin having a relative permittivity of 3.6 or more at 10 GHz, and a second adhesive layer surrounding the second coating layer;
wherein the first insulated wire and the second insulated wire are arranged on the on the wiring adhesive sheet to cross each other at a crossing point so as to define a void between the first insulated wire and the second insulated wire adjacent the crossing point.

14. The multi-layer wiring board of claim 13, wherein the first insulated wire is disposed under the second insulated wire in a region in which the first and second insulated wires cross each other such that the second insulated wire is bent more than the first insulated wire in region in which the second insulated wire crosses over the first insulated wire.

15. The multi-layer wiring board of claim 13, wherein the wiring adhesive sheet has two or more types of characteristic impedances.

16. The multi-layer wiring board of claim 13, wherein the first coating layer comprises one or a combination of two or more of a fluorine resin, a polyamide imide resin, and a low-dielectric polyimide resin with a relative permittivity less than 3.6 at 10 GHz.

17. The multi-wire wiring board according to claim 13, wherein a strength of the first coating layer is lower than a strength of the second coating layer.

18. The multi-wire wiring board according to claim 13, wherein the first insulated wire is disposed on the wiring adhesive sheet in a state in which the first insulated wire is hardly bent.

19. The multi-wire wiring board according to claim 13, wherein the first adhesive layer comprises one or a combination of two or more of a fluorine resin, a polyamide imide resin, and a low-dielectric polyimide resin with a relative permittivity less than 3.6 at 10 GHz.

20. The multi-wire wiring board according to claim 13, further comprising a through-hole that penetrates the multi-wire wiring board.

* * * * *